(12) United States Patent
Nakamura et al.

(10) Patent No.: US 11,626,216 B2
(45) Date of Patent: Apr. 11, 2023

(54) WIRE HARNESS MANUFACTURING SYSTEM AND WIRE HARNESS MANUFACTURING METHOD

(71) Applicant: YAZAKI CORPORATION, Tokyo (JP)

(72) Inventors: Masashi Nakamura, Utsunomiya (JP); Satoshi Enomoto, Utsunomiya (JP); Yoshio Shionome, Utsunomiya (JP); Akiyoshi Kanazawa, Utsunomiya (JP); Tomokazu Kato, Utsunomiya (JP)

(73) Assignee: YAZAKI CORPORATION, Tokyo (JP)

( * ) Notice: Subject to any disclaimer, the term of this patent is extended or adjusted under 35 U.S.C. 154(b) by 425 days.

(21) Appl. No.: 16/932,675

(22) Filed: Jul. 17, 2020

(65) Prior Publication Data
US 2021/0020336 A1    Jan. 21, 2021

(30) Foreign Application Priority Data

Jul. 18, 2019   (JP) ............................. JP2019-132457

(51) Int. Cl.
*H01B 13/012*      (2006.01)
*B60R 16/02*       (2006.01)
*G01R 31/69*       (2020.01)

(52) U.S. Cl.
CPC ... *H01B 13/01209* (2013.01); *B60R 16/0207* (2013.01); *G01R 31/69* (2020.01)

(58) Field of Classification Search
CPC .............. H01B 13/01209; G01R 31/69; B60R 16/0207

USPC .................................................. 324/691, 539
See application file for complete search history.

(56) References Cited

U.S. PATENT DOCUMENTS

| 4,689,551 | A  | * | 8/1987 | Ryan ...................... | G01R 31/58 |
|           |    |   |        |                            | 379/22.03  |
| 5,623,199 | A  | * | 4/1997 | Taniguchi .............. | G01R 31/66 |
|           |    |   |        |                            | 324/538    |
| 7,368,919 | B2 | * | 5/2008 | Gervais .................. | G01R 31/58 |
|           |    |   |        |                            | 324/503    |
| 7,728,605 | B2 | * | 6/2010 | Gervais .................. | G01R 31/58 |
|           |    |   |        |                            | 324/503    |

(Continued)

FOREIGN PATENT DOCUMENTS

| CN | 102763106 A | * | 10/2012 | ........... G06F 17/509 |
| CN | 111645617 A | * | 9/2020  | ......... B60R 16/0207 |

(Continued)

OTHER PUBLICATIONS

English Translation of WO2015083803A1. (Year: 2022).*
A statement of common ownership for US20190275966 and U.S. Pat. No. 11,021,118.

*Primary Examiner* — Jermele M Hollington
*Assistant Examiner* — Sean Curtis
(74) *Attorney, Agent, or Firm* — Kenealy Vaidya LLP

(57) ABSTRACT

A wire harness manufacturing system includes a conduction inspection device configured to inspect a conductive state at a position of other end of each of a plurality of sub-harnesses in a state that one end of each of the plurality of sub-harnesses is connected to a control box, and an information writing device configured to write terminal information of the plurality of sub-harnesses in a box side storage portion of the control box.

8 Claims, 10 Drawing Sheets

(56) References Cited

U.S. PATENT DOCUMENTS

| | | | | |
|---|---|---|---|---|
| 8,912,800 | B2* | 12/2014 | Gervais | G01R 31/58 |
| | | | | 324/540 |
| 9,018,958 | B2* | 4/2015 | Bertness | G01R 31/006 |
| | | | | 324/754.01 |
| 10,464,504 | B2* | 11/2019 | Nakamura | B60R 16/0215 |
| 10,661,729 | B2* | 5/2020 | Nakamura | B60R 16/0207 |
| 10,800,361 | B2* | 10/2020 | Nakamura | B60R 16/0215 |
| 10,919,462 | B2* | 2/2021 | Nakamura | B60R 16/0239 |
| 10,933,822 | B2* | 3/2021 | Enomoto | B60R 16/0315 |
| 11,021,118 | B2* | 6/2021 | Nakamura | G01R 3/00 |
| 11,302,461 | B2* | 4/2022 | Kawase | H01B 13/012 |
| 11,355,267 | B2* | 6/2022 | Kawase | H01B 13/01245 |
| 11,456,093 | B2* | 9/2022 | Kawase | H01B 13/01209 |
| 2003/0141878 | A1* | 7/2003 | Shinzou | G01R 31/60 |
| | | | | 324/539 |
| 2008/0238438 | A1* | 10/2008 | Gervais | G01R 31/58 |
| | | | | 324/539 |
| 2010/0259277 | A1* | 10/2010 | Johnson | G01R 31/31905 |
| | | | | 324/537 |
| 2015/0340132 | A1* | 11/2015 | Kitada | B60R 16/0215 |
| | | | | 29/825 |
| 2015/0349471 | A1* | 12/2015 | Maki | H01R 13/6691 |
| | | | | 307/10.1 |
| 2018/0108458 | A1* | 4/2018 | Maki | H01R 43/20 |
| 2019/0074641 | A1* | 3/2019 | Maki | B60R 16/0215 |
| 2019/0118739 | A1* | 4/2019 | Takamatsu | B60R 16/0207 |
| 2019/0118742 | A1* | 4/2019 | Takamatsu | H01R 13/62 |
| 2019/0118743 | A1* | 4/2019 | Takamatsu | H01B 7/0045 |
| 2019/0118744 | A1* | 4/2019 | Takamatsu | B60R 16/02 |
| 2019/0123472 | A1* | 4/2019 | Takamatsu | B60R 16/033 |
| 2019/0123480 | A1* | 4/2019 | Takamatsu | H04L 12/66 |
| 2019/0123920 | A1* | 4/2019 | Takamatsu | B60R 16/0315 |
| 2019/0123937 | A1* | 4/2019 | Takamatsu | H04L 12/42 |
| 2019/0126860 | A1* | 5/2019 | Takamatsu | B60R 16/03 |
| 2019/0126862 | A1* | 5/2019 | Sasaki | B60R 16/0238 |
| 2019/0126863 | A1* | 5/2019 | Naganishi | B60R 16/02 |
| 2019/0126864 | A1* | 5/2019 | Takamatsu | H01B 7/0045 |
| 2019/0126865 | A1* | 5/2019 | Takamatsu | B60R 16/033 |
| 2019/0168692 | A1* | 6/2019 | Nakamura | B60R 16/0238 |
| 2019/0168693 | A1* | 6/2019 | Nakamura | B60R 16/0238 |
| 2019/0168695 | A1* | 6/2019 | Nakamura | B60R 16/0215 |
| 2019/0275966 | A1* | 9/2019 | Nakamura | B60R 16/0207 |
| 2019/0344731 | A1* | 11/2019 | Enomoto | B60R 16/023 |
| 2019/0391197 | A1* | 12/2019 | Oh | G01R 31/69 |
| 2020/0357541 | A1* | 11/2020 | Kawase | H01B 13/01245 |
| 2020/0357542 | A1* | 11/2020 | Kawase | H01B 13/01227 |
| 2021/0005357 | A1* | 1/2021 | Kawase | H01B 13/01209 |
| 2021/0020336 | A1* | 1/2021 | Nakamura | H01B 13/01209 |
| 2021/0197743 | A1* | 7/2021 | Takamatsu | H01B 7/0045 |

FOREIGN PATENT DOCUMENTS

| | | | | |
|---|---|---|---|---|
| CN | 111665791 | A * | 9/2020 | G05B 19/4183 |
| EP | 715173 | A2 * | 6/1996 | G01R 31/04 |
| EP | 3 476 660 | A1 | 5/2019 | |
| EP | 3 536 560 | A1 | 9/2019 | |
| EP | 3536560 | A1 * | 9/2019 | B60R 16/0207 |
| EP | 3566910 | A1 * | 11/2019 | B60L 1/00 |
| EP | 3736836 | A1 * | 11/2020 | H01B 13/012 |
| EP | 3736837 | A1 * | 11/2020 | G06F 30/20 |
| EP | 3761323 | A1 * | 1/2021 | H01B 13/012 |
| EP | 3766741 | A1 * | 1/2021 | B60R 16/0207 |
| JP | H07220542 | A * | 8/1995 | |
| JP | H085694 | A * | 1/1996 | |
| JP | H08233889 | A * | 9/1996 | |
| JP | 2004356022 | A * | 12/2004 | B60R 16/0207 |
| JP | 3821418 | B2 * | 9/2006 | G01R 31/045 |
| JP | 4121420 | B2 * | 7/2008 | |
| JP | 2013-254575 | A | 12/2013 | |
| JP | 2016-22826 | A | 2/2016 | |
| JP | 5986710 | B2 * | 9/2016 | |
| JP | 2017-4651 | A | 1/2017 | |
| JP | 6675293 | B2 * | 4/2020 | B60R 16/0207 |
| KR | 20020060383 | A * | 7/2002 | |
| NO | 2015/083803 | A1 | 6/2015 | |
| WO | WO-2011096543 | A1 * | 8/2011 | B60R 16/0207 |
| WO | WO-2015083803 | A1 * | 6/2015 | G01R 31/021 |
| WO | 2017/222074 | A1 | 12/2017 | |
| WO | WO-2017222074 | A1 * | 12/2017 | B60R 16/02 |
| WO | WO-2019086090 | A1 * | 5/2019 | F03D 80/85 |
| WO | WO-2019245052 | A1 * | 12/2019 | H01B 13/01209 |
| WO | WO-2022122149 | A1 * | 6/2022 | |

* cited by examiner

WIRE HARNESS MANUFACTURING SYSTEM AND WIRE HARNESS MANUFACTURING METHOD

CROSS REFERENCE TO RELATED APPLICATIONS

This application claims priority from Japanese Patent Application No. 2019-132457 filed on Jul. 18, 2019, the entire contents of which are incorporated herein by reference.

BACKGROUND OF THE INVENTION

Field of the Invention

The present invention relates to a system and a method for manufacturing a wire harness which includes a control box and a plurality of sub-harnesses.

Description of Related Art

A wire harness is installed in an automobile. The wire harness includes: a control box configured to supply power supply power to a downstream side; and a harness body which is provided with the control box at a terminal thereof (see, for example, Patent Literature 1 below). The control box is connected to a battery, an alternator, or the like mounted on the automobile, and the power supply power is supplied to a downstream electric device (electric equipment). In the control box, a microcomputer and a plurality of intelligent power devices (IPD) are mounted on a board. The IPDs include a switching element and the like in this configuration. Moreover, the control box can control supply of the power supply power to the downstream side by controlling the IPDs with the microcomputer. The microcomputer is configured to control the IPDs based on terminal information written in advance during manufacturing of the board. Meanwhile, the harness body includes a plurality of sub-harnesses. Each sub-harness includes a plurality of electric wires and connectors provided at terminals of the electric wires. A connector located at one end of each sub-harness is connector-connected to the control box. Moreover, a connector located at the other end (connector located on a side away from the control box) is connector-connected to the electric device (electric equipment). The electric device (electric equipment) corresponds to various lamps and motors, switch devices for operating the lamps and motors, sensors, and the like.

[Patent Literature 1] JP-A-2016-22826

In the related art above, the terminal information is written on the board at the time of manufacturing the board so as to be linked one-to-one to a plurality of box side connectors (frontage on the side of the control box) formed on the control box. Therefore, a connection destination of each connector of the sub-harness is determined at the time of manufacturing the wire harness. Therefore, if there is a difference in vehicle type, grade, destination (domestic/overseas) or the like, it is necessary to newly design and manufacture the control box, and product numbers (varieties) of the control box may be increased.

SUMMARY

One or more embodiments provide a wire harness manufacturing system and a wire harness manufacturing method which are capable of preventing the increase in the product numbers (varieties) of the control box even though a difference of the vehicle type, grade, destination, or the like.

In an aspect (1), a wire harness manufacturing system includes a conduction inspection device configured to inspect a conductive state at a position of other end of each of a plurality of sub-harnesses in a state that one end of each of the plurality of sub-harnesses is connected to a control box, and an information writing device configured to write terminal information of the plurality of sub-harnesses in a box side storage portion of the control box.

According to the aspect (1), the information writing device used together with the conduction inspection device is included in the configuration of the system, so that the information writing device can write the terminal information later during conduction inspection performed after assembly of the wire harness. That is, the terminal information can be written in the control box later according to the vehicle type, grade, destination, and the like. In other words, the terminal information of the sub-harness can be written in the control box by the information writing device after the sub-harness is connected to the control box. Therefore, there is no need to newly design and manufacture the control box even if there is a difference in the vehicle type, grade, destination, and the like. Therefore, the increase in the product numbers (varieties) of the control box and a board of the control box can be prevented and the control box and the board can be commonly designed.

In an aspect (2), the information writing device may include a numerical value acquisition portion configured to acquire an electric numerical value at the position of the other end of each of the plurality of sub-harnesses in the conductive state, a terminal information storage portion configured to store a plurality of the terminal information corresponding to the plurality of sub-harnesses, and an information writing portion configured to read corresponding terminal information from the terminal information storage portion based on the electric numerical value and write the corresponding terminal information in the box side storage portion.

According to the aspect (2), since the information writing device is provided with the numerical value acquisition portion, the numerical value acquisition portion can acquire the electric numerical value at the position of the other end of the sub-harness. Moreover, since the information writing device includes the terminal information storage portion, the terminal information corresponding to the sub-harness can be stored in advance in the terminal information storage portion. Moreover, since the information writing device includes the information writing portion, the corresponding terminal information can be read by the information writing portion from the terminal information storage portion based on the electric numerical value, and the read terminal information can be written in the box side storage portion of the control box. Therefore, the information writing device, which has a better configuration, can be provided.

In an aspect (3), the information writing device may further include a synchronizing portion which enable to write the terminal information during inspecting the conductive state.

According to the aspect (3), since the information writing device is provided with the synchronizing portion, the inspection of the conductive state and the writing of the terminal information can be performed in synchronization. Therefore, work time related to the conduction inspection can be prevented from being lengthened, and the number of work steps can be reduced.

In an aspect (4), the conduction inspection device may include a plurality of checker fixtures for conduction check. The plurality of checker fixtures may be integrally or separately provided with the numerical value acquisition portion.

According to the aspect (4), since the numerical value acquisition portion of the information writing device is provided in the checker fixture of the conduction inspection device, a size of the system can be prevented from increasing. The checker fixture may be replaced by a substitution as long as the substitution has a function equivalent to that of the checker fixture.

In an aspect (5), the numerical value acquisition portion which is integrally provided may be configured to read a resistance value of the checker fixture when a predetermined current is applied from the control box side.

According to the aspect (5), the corresponding terminal information can be read from the terminal information storage portion based on the resistance value adopted as the electric numerical value, and then the process can proceed to the writing of the terminal information.

In an aspect (6), the numerical value acquisition portion which is separately provided may be configured to read a resistance value of the checker fixture when a predetermined current is applied from the control box side.

According to the aspect (6), the corresponding terminal information can be read from the terminal information storage portion based on the conductor resistance value adopted as the electric numerical value, and then the process can proceed to the writing of the terminal information.

In an aspect (7), a connection portion of the one end of each of the plurality of sub harnesses may be connectable to a frontage of each of a plurality of box side connectors provided in the control box.

According to the aspect (7), the sub-harness can be connected to any box side connector of the control box. Since the terminal information suitable for the sub-harness can be written in the control box after the sub-harness is connected, it is effective for a common design of the control box and the board.

In an aspect (8), a wire harness manufacturing method includes connecting one end of each of a plurality of sub-harnesses to a control box, using a conduction inspection device and inspecting a conductive state at a position of other end of each of the plurality of sub-harnesses, and using an information writing device and writing terminal information of the plurality of sub-harnesses in a box side storage portion of the control box.

According to the aspect (8), the terminal information of the sub-harness can be written in the control box by the information writing device after the sub-harness is connected to the control box. Therefore, there is no need to newly design and manufacture the control box even if there is a difference in the vehicle type, grade, destination, and the like. The increase in the product numbers (varieties) of the control box can be prevented. Regarding the effect, the control box and the board can be commonly designed without increasing the product numbers (varieties) of the board of the control box.

According to one or more embodiments, an increase in product numbers (varieties) of a control box can be prevented even if there is a difference in a vehicle type, grade, destination, and the like.

BRIEF DESCRIPTION OF THE DRAWINGS

FIG. 1A is a schematic view of an automobile. FIG. 1B is a flowchart up to installation.

DETAILED DESCRIPTION

A wire harness manufacturing system includes a conduction inspection device and an information writing device. The conduction inspection device is a device configured to inspect a conductive state at a position of other end of each of a plurality of sub-harnesses in a state that one end of each of the plurality of sub-harnesses is connected to a control box. The information writing device is a device configured to write terminal information of the plurality of sub-harnesses in a box side storage portion of the control box while using the conduction inspection device. The wire harness manufacturing system is configured such that the terminal information can be written in the control box later by the information writing device according to a vehicle type, grade, destination, and the like. In the wire harness manufacturing system, it is preferable that a connection portion shape of each one end of the plurality of sub-harnesses and each frontage shape of a plurality of box side connectors provided in the control box are formed in common.

Embodiment

Figure 1A:
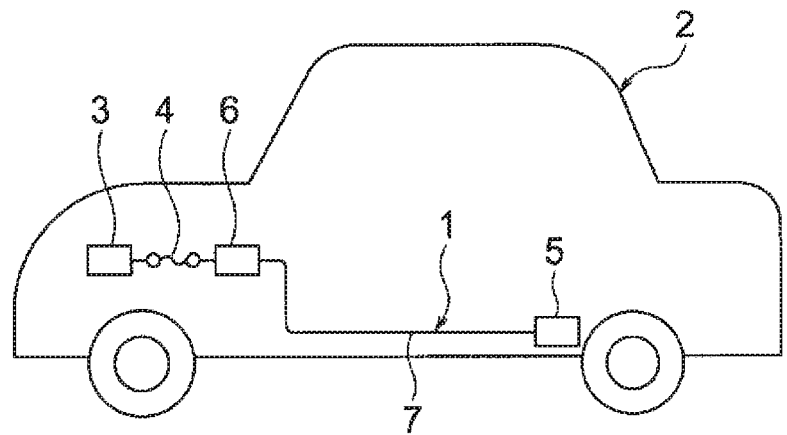
FIGS. 1A and 1B show an embodiment of a wire harness manufacturing system and a wire harness manufacturing method.
Figure 1B:
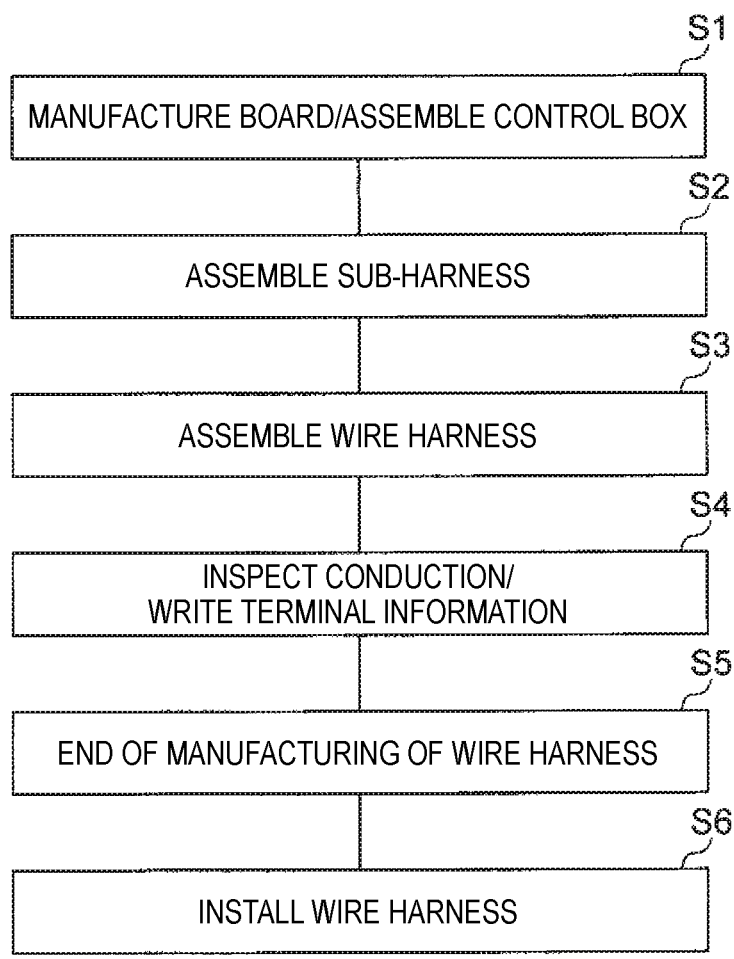
Figure 2:
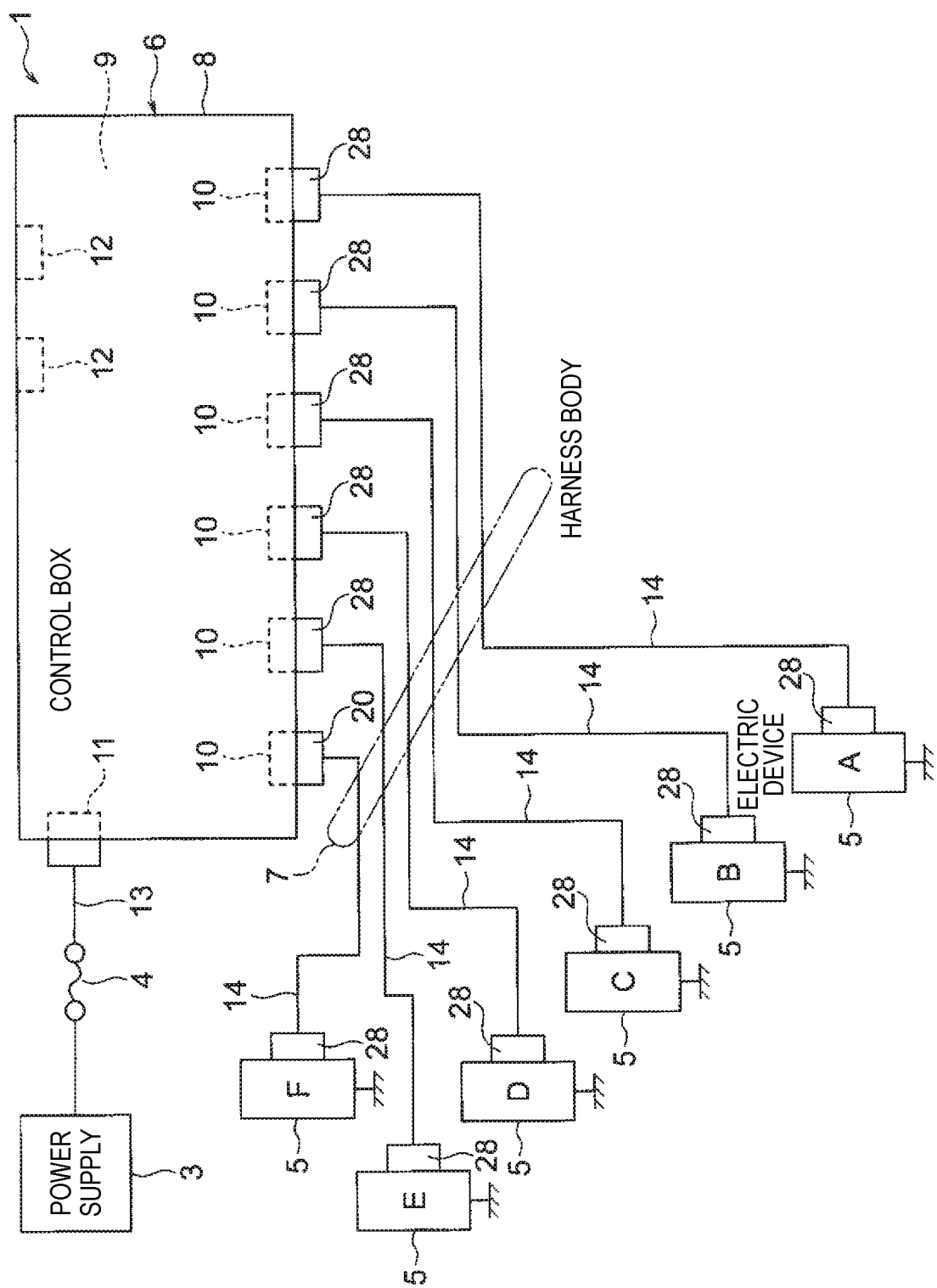
FIG. 2 is a block diagram showing a state where a wire harness is installed.
Figure 3:
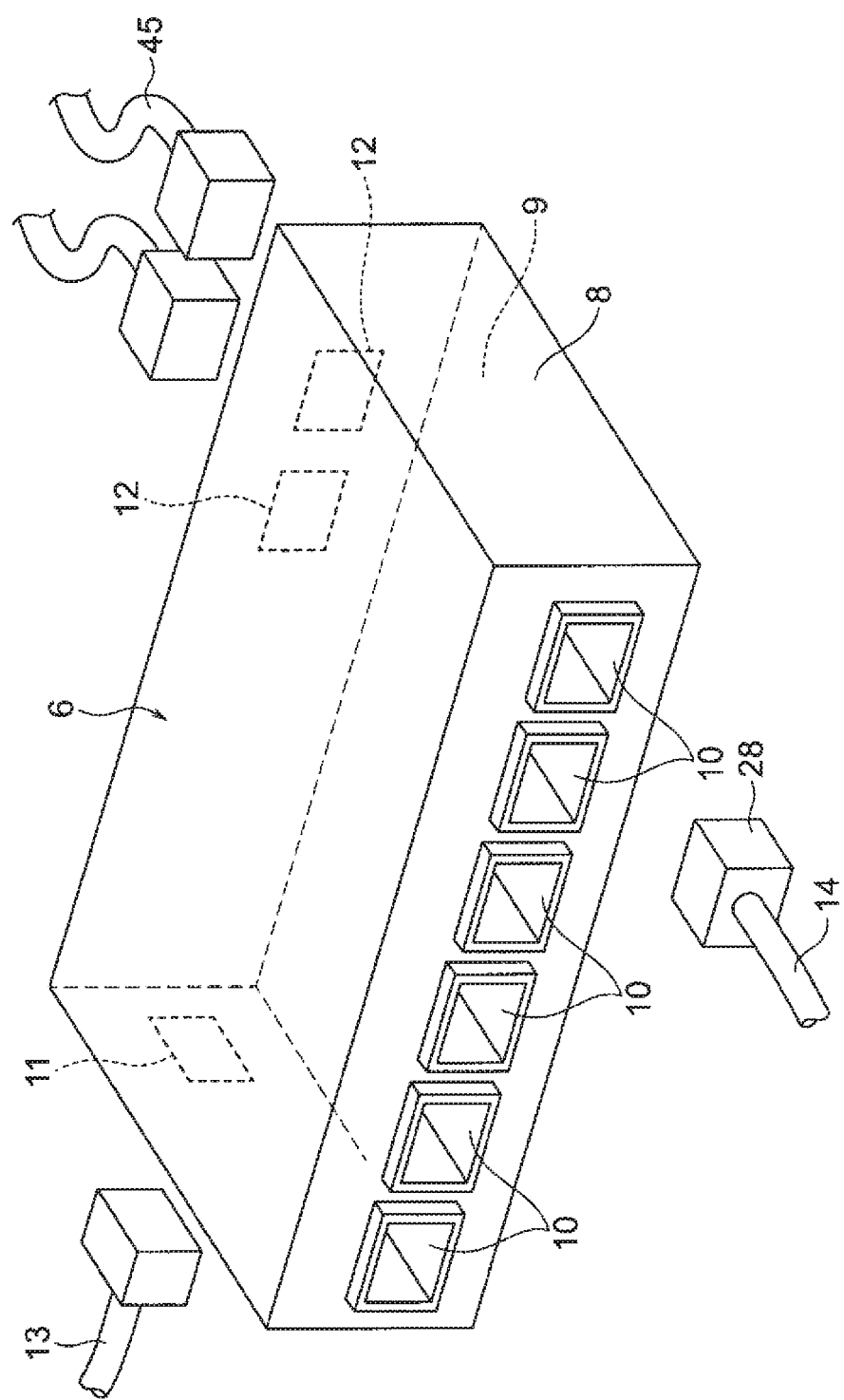
FIG. 3 is a perspective view schematically showing an appearance of a control box.
Figure 4:
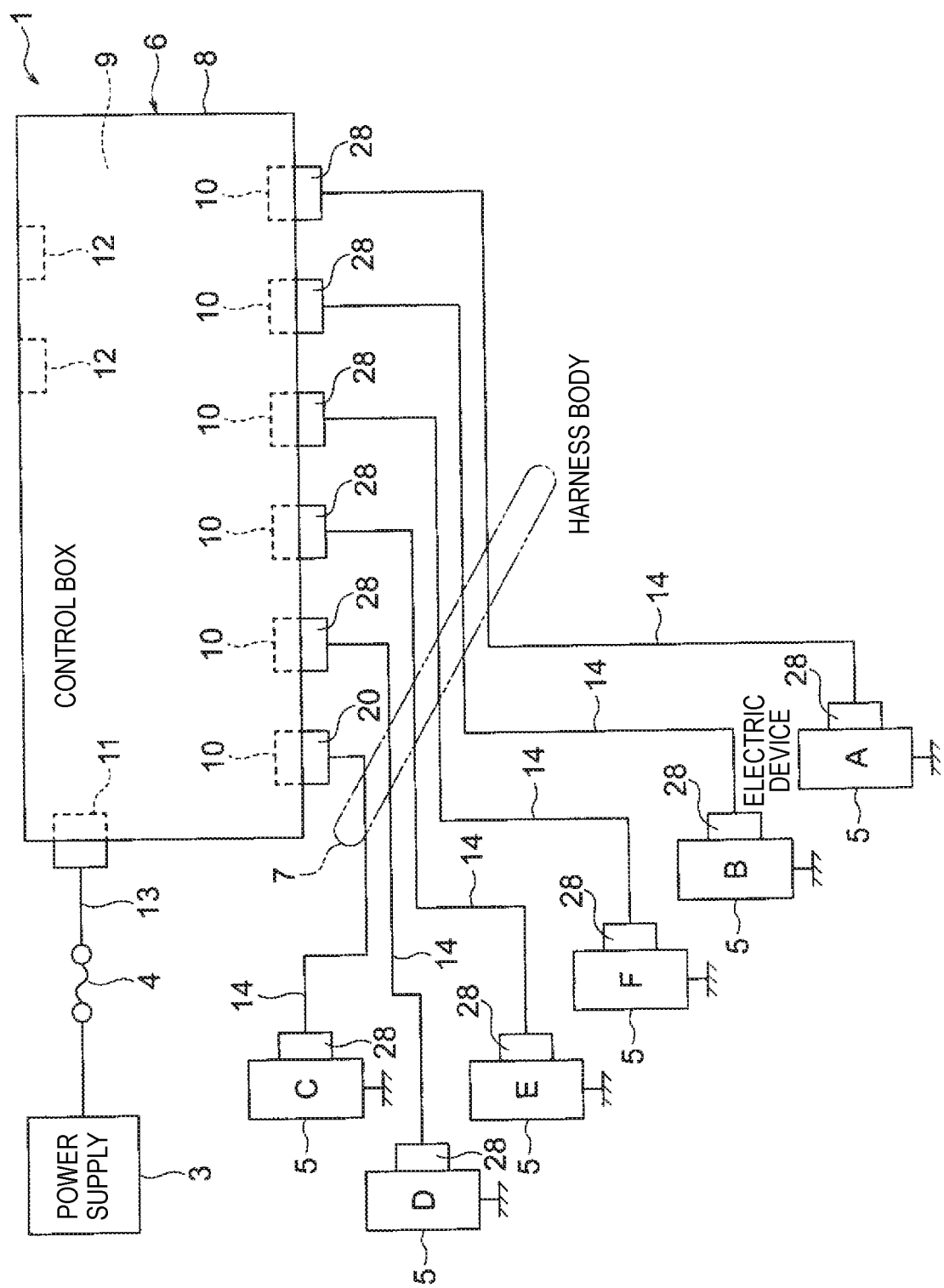
FIG. 4 is a block diagram showing a modification of the wire harness of FIG. 2.
Figure 5:
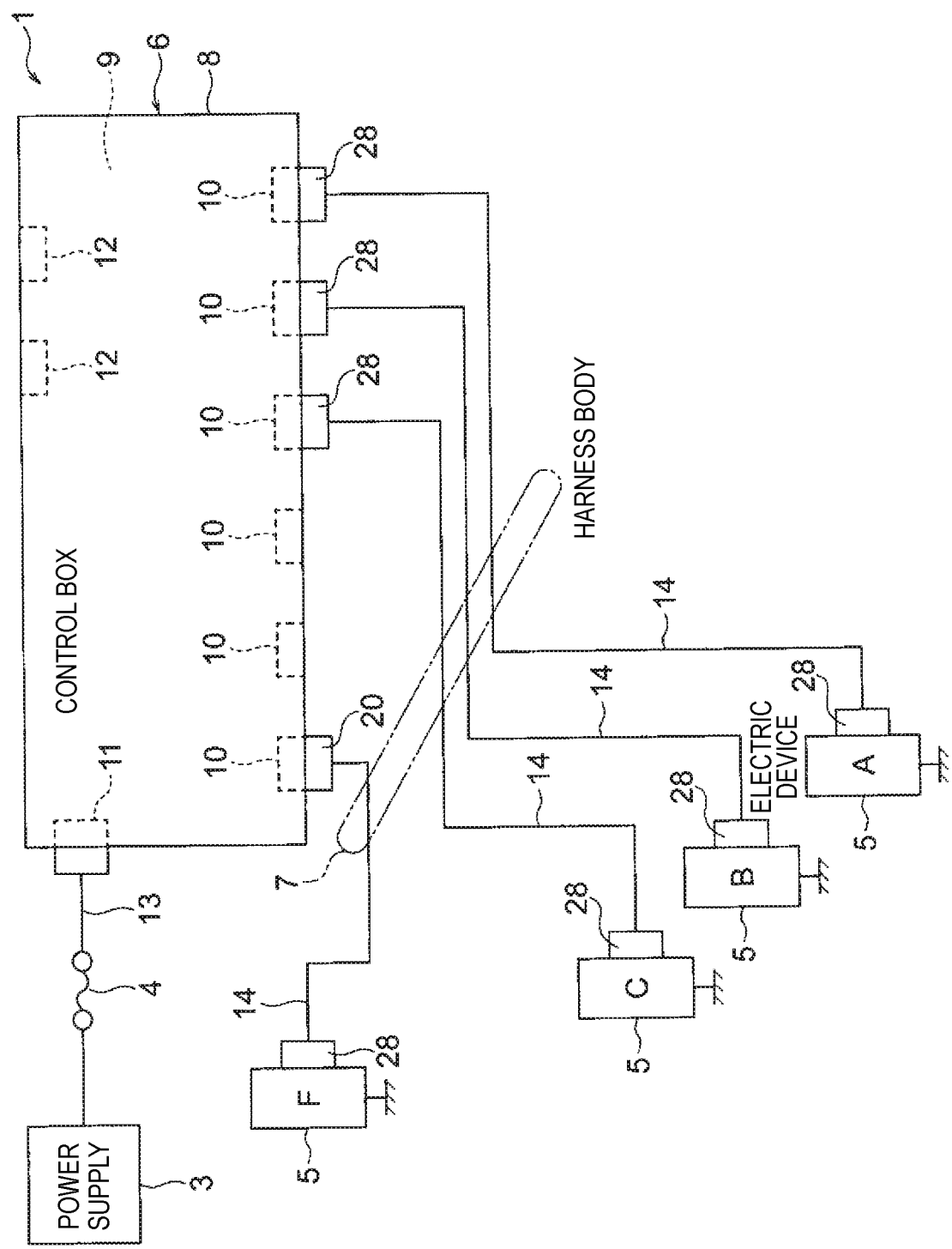
FIG. 5 is a block diagram showing another modification of the wire harness of FIG. 2.
Figure 6:
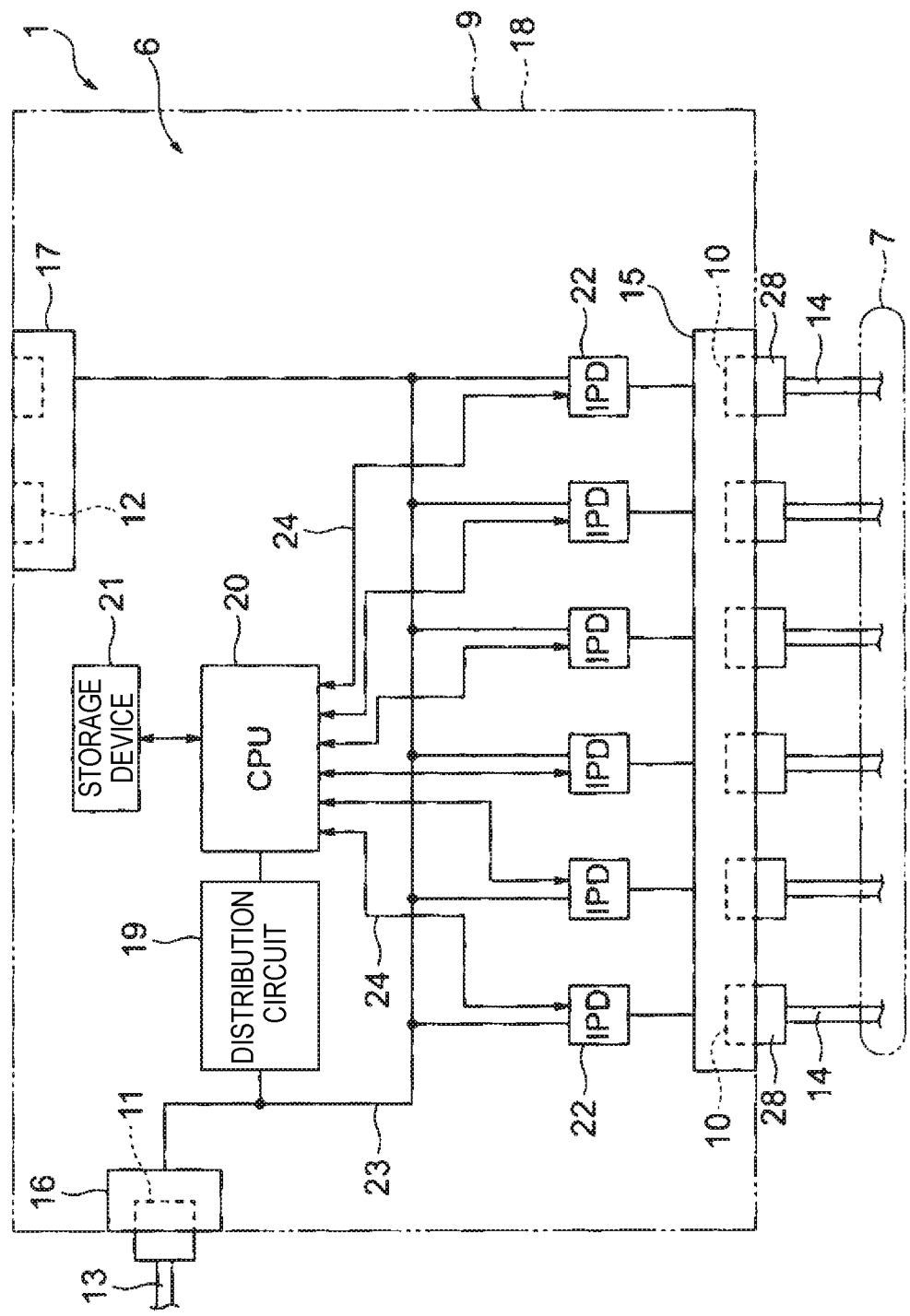
FIG. 6 is a block diagram showing a configuration of the control box of FIG. 2.
Figure 7:
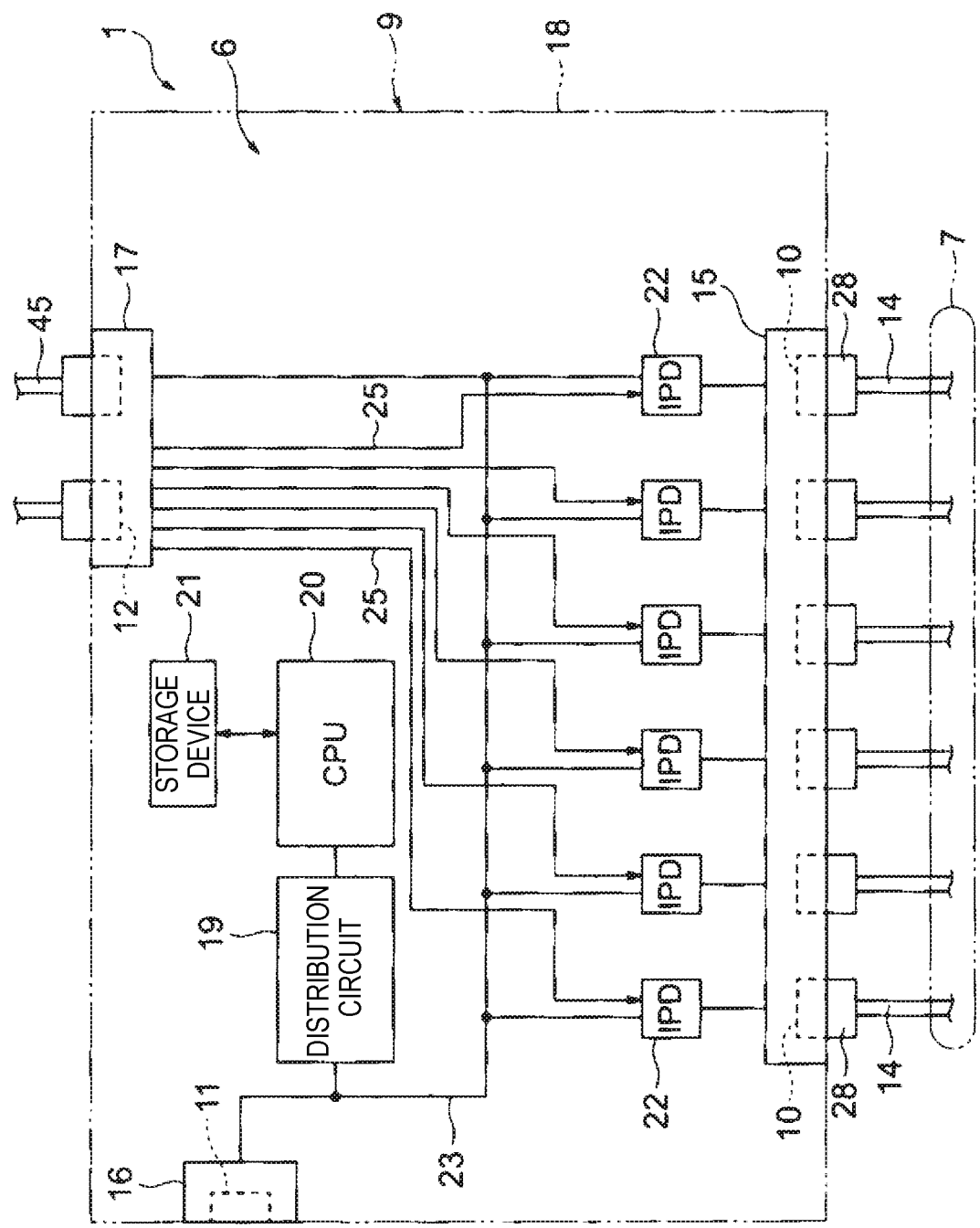
FIG. 7 is a block diagram showing a state where terminal information is written in the control box.
Figure 8:
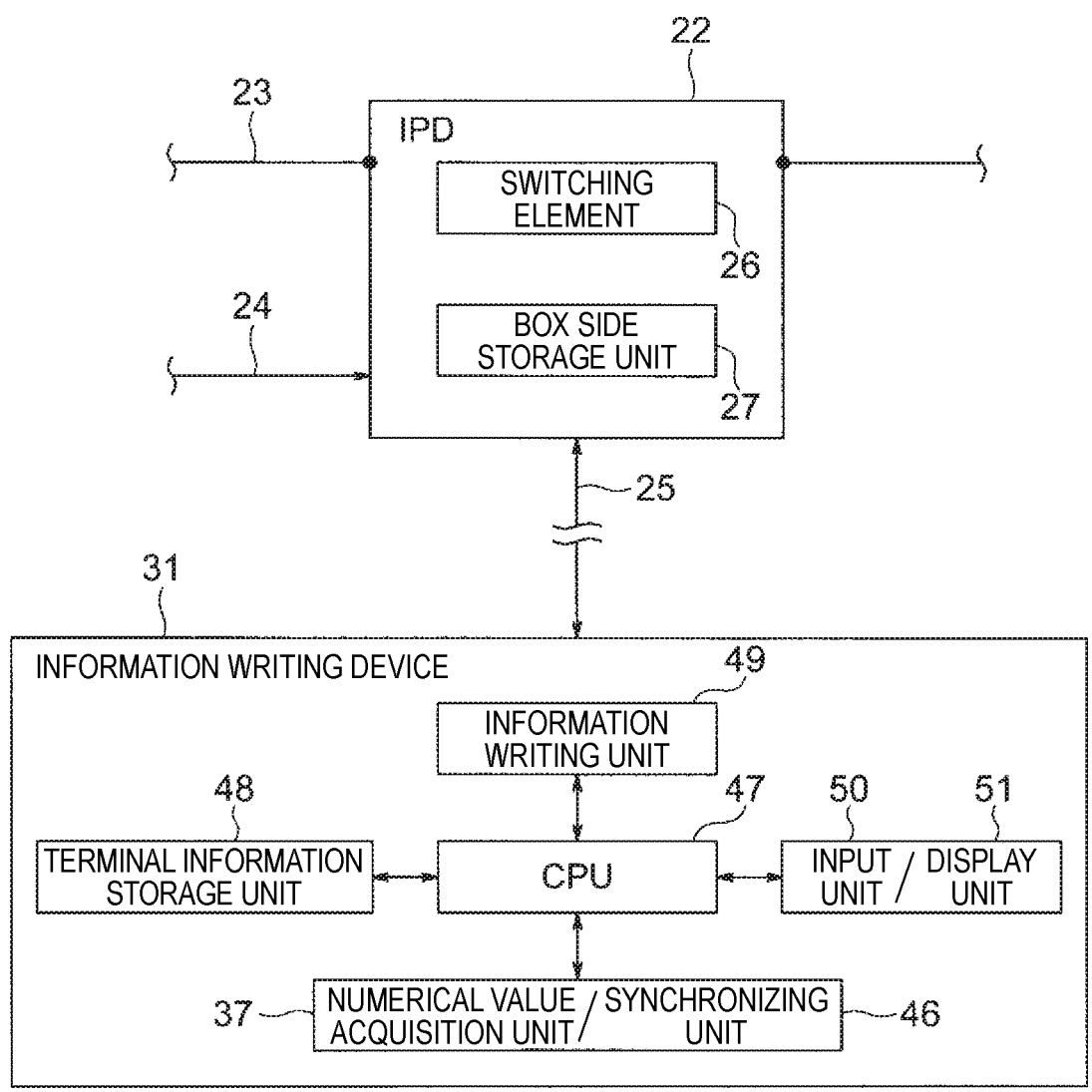
FIG. 8 is a block diagram showing a configuration of an information writing device.
Figure 9:
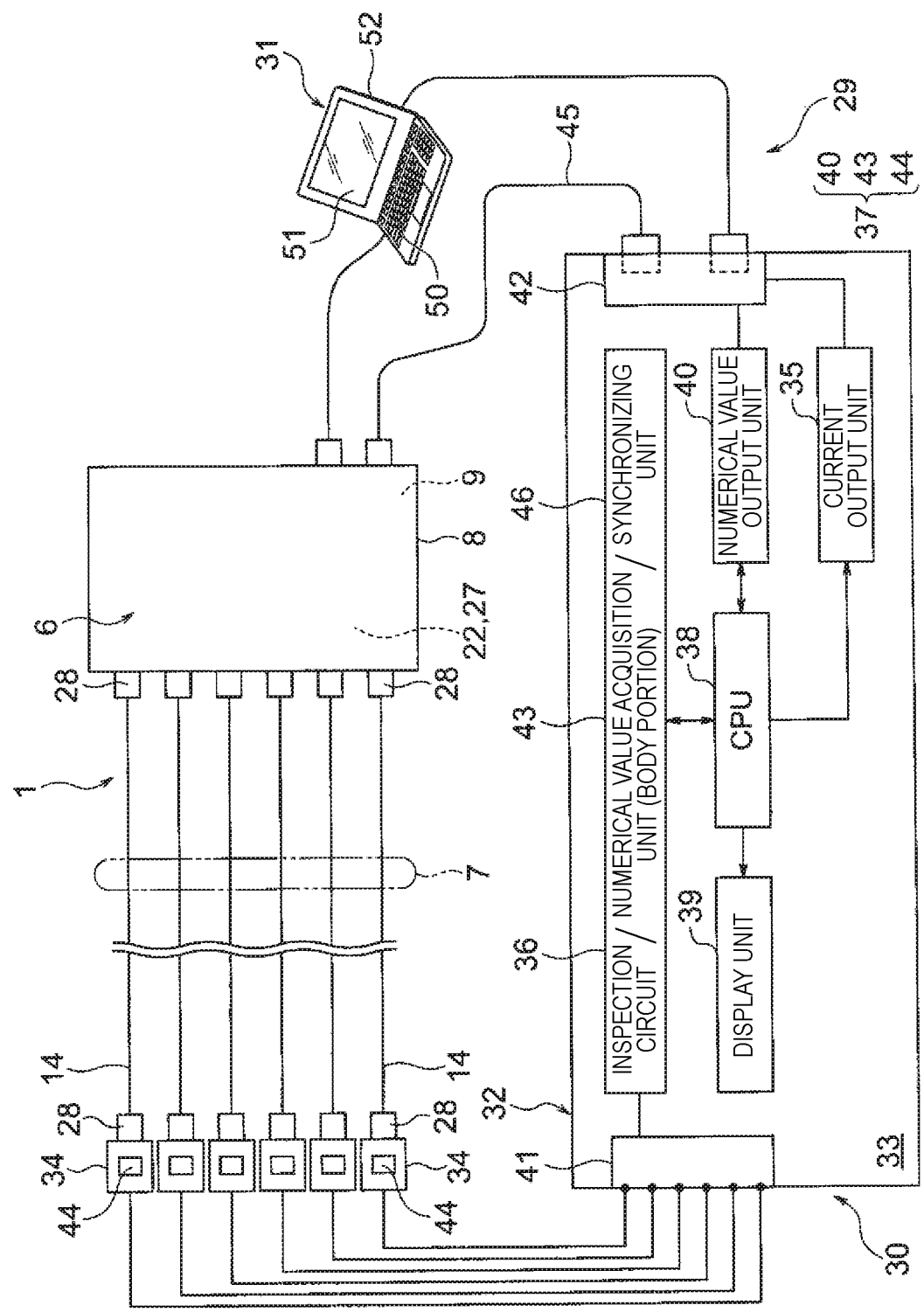
FIG. 9 is a block diagram showing a configuration of a conduction inspection device and the information writing device.
Figure 10:
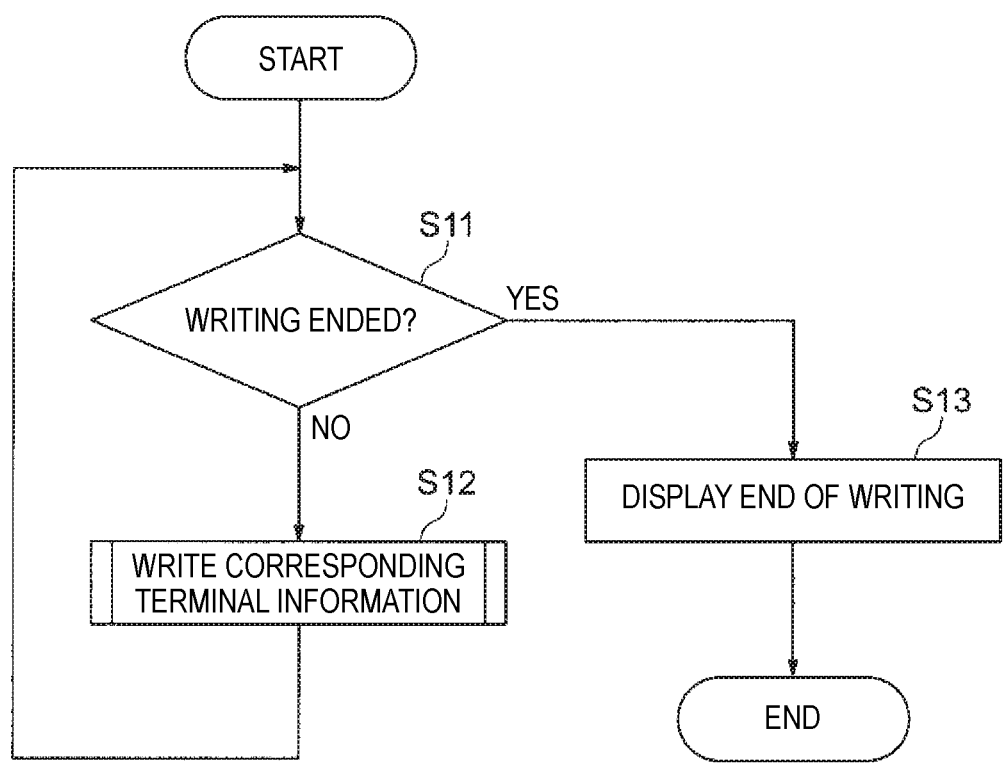
FIG. 10 is a flowchart for writing the terminal information.

Hereinafter, an embodiment will be described with reference to the drawings. FIGS. 1A and 1B show an embodiment of a wire harness manufacturing system and a wire harness manufacturing method. Moreover, FIG. 2 is a block diagram showing a state where a wire harness is installed. FIG. 3 is a perspective view schematically showing an appearance of a control box. FIGS. 4 and 5 are block diagrams showing modifications of the wire harness of FIG. 2. FIG. 6 is a block diagram showing a configuration of the control box of FIG. 2. FIG. 7 is a block diagram showing a state where terminal information is written in the control box. FIG. 8 is a block diagram showing a configuration of an information writing device. FIG. 9 is a block diagram showing a configuration of a conduction inspection device and the information writing device. FIG. 10 is a flowchart for writing the terminal information.

<Wire Harness 1>

In FIG. 1A, a wire harness 1 is installed in an automobile 2. The wire harness 1 is connected to a power supply 3, such as a battery or an alternator mounted in an engine room of the automobile 2, and a fuse box 4, and is configured to be capable of supplying power supply power to a plurality of electric devices 5 (and/or electric equipment) located on a downstream side. The wire harness 1 is installed on a floor and/or under the floor of the automobile 2. It should be noted that the wire harness 1 described herein is assumed to have an elongated shape. The wire harness 1 includes: a control box 6 configured to supply the power supply power to the downstream side; and a harness body 7 which is provided with the control box 6 at an upstream side terminal (one end) thereof. The automobile 2 is not limited to an automobile equipped with a general gasoline engine or diesel engine, and may be an electric automobile which uses a motor as a drive source or a hybrid automobile which uses a motor and an engine as the drive source, or the like. The control box 6 constituting the wire harness 1 is an example, and the embodiment can also be applied to, for example, a control box or a power distribution box which is capable of communicating. In addition, the control box 6, the above control box or power distribution box which is capable of communicating and the like may also be referred to as electric junction boxes.

<Flow Until Wire Harness 1 is Installed>

In FIG. 1B, the wire harness 1 is installed along a path at a predetermined position in the automobile 2 through a flow of steps S1 to S6, for example. In step S1, a board and various components constituting the control box 6 are manufactured. Then assembly is performed through using the board and the components. As a result, the control box 6 is completed. In step S2, a plurality of sub-harnesses constituting the harness body 7 are manufactured. In step S2, an electric wire is cut into a predetermined length, and a terminal fitting is provided at a terminal of the electric wire. A connector is formed by accommodating the terminal fitting in a connector housing. Step S2 may also be performed simultaneously with or before step S1. In step S3, the wire harness 1 is assembled in step S3, the plurality of sub-harnesses are connected to the control box 6, the plurality of sub-harnesses are wound with a tape, and a protector, a clip, and the like are assembled to predetermined positions to assemble the wire harness 1. Upon completion of the assembly in step S3. the process proceeds to step S4. In step S4, conduction inspection of the wire harness 1 is performed. At the same time, terminal information related to the plurality of sub-harnesses (and related to the electric devices 5) is written on the board of the control box 6. In step S4, a wire harness manufacturing system 29 (see FIG. 9) and a wire harness manufacturing method are employed. When step S4 is completed, the manufacturing of the wire harness 1 is completed as shown in step S5, and the wire harness 1 is conveyed to an automobile manufacturing line or the like. Then, in step S6, the wire harness 1 is installed in the automobile 2.

<Configuration of Wire Harness and Plurality of Electric Devices>

In FIG. 2, the wire harness 1 includes the control box 6 and the harness body 7 as described above. Although not particularly shown, the wire harness 1 also includes exterior members such as a protector and a corrugated tube, a fixing member such as a clip, and a water stop member such as a grommet. The upstream side of the wire harness 1 is connected to the power supply 3 via the fuse box 4. The plurality of electric devices 5 (and/or electric equipment) are connected to the downstream side of the wire harness 1. Examples of the plurality of electric devices 5 include: a door lock motor, a power window motor, a lamp, an outer mirror, a courtesy switch, an outer mirror switch, a seat heater, a hazard switch, a roof LED, a vanity switch, a vanity lamp, a rear LED, an E latch, various sensors, and the like (as examples). Connections on the downstream side may also be integrated as device modules including the electric devices 5. Specifically, the device modules may include a door region device module, a floor region device module, a roof region device module, a rear region device module, or the like. For convenience of description, letters A to F are shown in the drawings regarding the plurality of electric devices 5. Although the wire harness 1 includes one control box 6 in the present embodiment, the wire harness 1 may also include a plurality of control boxes 6 existing in the middle of the path in accordance with the above device modules.

The wire harness 1 is configured to supply DC power supply power (for example, +12 [V]) from the power supply 3 to the electric devices 5 arranged at various locations, and to perform electric connection for transmitting electric signals output from the electric devices 5 to other locations. In the present embodiment, description and illustration of functions of electric signal systems and communication systems related to switches and sensors will be omitted.

<Control Box>

In FIGS. 2, 3, and 6, the control box 6 is an electric junction box capable of distributing the power supply power, and includes: a case 8; a board 9 accommodated in the case 8; a plurality of box side connectors 10; a power supply connection portion 11, and two external connection portions 12. The case 8 has a size capable of accommodating the board 9. A plurality of fixing leg portions (not shown) are formed in the case 8 as fixing portions. The control box 6 is fixed to a vehicle body or the like by the fixing leg portions. The plurality of box side connectors 10, the power supply connection portion 11, and the two external connection portions 12 are arranged on a side face of the case 8. Although the power supply connection portion 11 shown herein has a connector shape, the present invention is not limited thereto. That is, since a case where a power supply line 13 is drawn into the case 8 is also conceivable, the present invention is not limited to the shown example. The plurality of box side connectors 10 are formed as portions to be connected with a plurality of sub-harnesses 14 constituting the harness body 7. The plurality of box side connectors 10 have the same opening shape (also referred to as a housing opening shape or frontage shape). That is, the box side connectors 10 are formed to have a common shape. Although the box side connectors 10 herein are all formed in the same shape, a configuration, in which only those box side connectors 10 corresponding to differences in vehicle types, grades, and destinations (domestic/overseas) are formed in the same shape, may also be employed, for example. The plurality of box side connectors 10 are mounted on an edge of the board 9 which serves as an interface 15. The power supply connection portion 11 is formed as an input portion of the power supply line 13. The power supply connection portion 11 is mounted on an edge of the board 9 which serves as an interface 16. The two external connection portions 12 are formed as portions to be connected with a conduction inspection device 30 and an information writing device 31 described below. The two external connection portions 12 are mounted on an edge of the board 9 which serves as an interface 17.

The control box 6 is configured such that the plurality of sub-harnesses 14 can be connected in various states, such as a state where A to F described for the convenience of the electric devices 5 are arranged in an order shown in FIG. 2, or a state where C to F of FIG. 2 are different as shown in FIG. 4, or a state where D and E of FIG. 2 are not present as shown in FIG. 5. This is because the wire harness manufacturing system 29 including the conduction inspection device 30 and the information writing device 31 described below allows writing terminal information related to the plurality of sub-harnesses 14 (and related to the electric devices 5) to be written later in the control box 6. Here, a configuration of the board 9 on which the terminal information is written will be described below.

<Configuration of Board>

See FIGS. 6 and 7, the board 9 includes: a board body 18; the above interfaces 15 to 17 mounted on edges of the board body 18; a distribution circuit 19 configured to distribute the power supply power; a microcomputer (CPU) 20; a storage device 21; a plurality of intelligent power devices (IPD) 22; a power supply line 23; and control lines 24, 25. The distribution circuit 19 is connected to the power supply line 23. The distribution circuit 19 is configured to be capable of distributing the power supply power to the plurality of sub-harnesses 14. The microcomputer 20 has a function of variously controlling the control box 6 by executing programs incorporated in advance. The control function also includes a function of controlling the plurality of IPDs 22 and a function of allowing control of the plurality of IPDs 22 from the wire harness manufacturing system 29 to be described below. The storage device 21 is provided as a portion configured to hold various data to be referred to when the microcomputer 20 performs control, operation, and the like. For example, a non-volatile memory is employed as the storage device 21. It is assumed that the storage device 21 may also have a function of a box side storage portion 27 (see FIG. 8) to be described below.

The plurality of IPDs 22 are configured to be capable of switching energization to the downstream side of the control box 6. As shown in FIG. 8, the plurality of IPDs 22 include: a switching element 26 (power MOSFET); and a peripheral circuit which is not shown (output current detection function, gate driver, various protection circuits, and the like). The plurality of IPDs 22 also includes the box side storage portion 27 which serves as a writing destination of the terminal information. It is assumed that the microcomputer 20 can turn on and off control signals output to each IPD 22 based on the terminal information written in the box side storage portion 27. Examples of the terminal information include a name of a terminal to be connected, an operation current value, an operation mode, a resistance value, and the like. The box side storage portion 27 includes, for example, a non-volatile memory, and is configured such that the terminal information can be written later by the information writing device 31 which will be described below. In other words, the box side storage portion 27 is configured such that the terminal information can be written during conduction inspection of the wire harness 1.

<Harness Body>

In FIGS. 2 to 5, the harness body 7 includes the plurality of sub-harnesses 14. The harness body 7 is formed in an elongated shape by bundling the plurality of sub-harnesses 14 having different lengths. It is preferable that the plurality of sub-harnesses 14 of the harness body 7 are I-typed or V-typed with respect to the control box 6 to facilitate automatic production. Each sub-harness 14 includes: a plurality of electric wires; and connectors 28 provided at one end and the other end of each electric wire. The plurality of electric wires of each sub-harness 14 are used as power supply lines and signal lines, and conductor materials, conductor diameters, and lengths thereof are various. Conductor resistance thereof is also various. The connector 28 includes: a terminal fitting (not shown) provided on a terminal of the electric wire; and a connector housing which accommodates the terminal fitting and is fitted to the box side connector 10 of the control box 6 (fitted to a connection portion of the electric device 5). It is assumed that the connector 28 which is fitted and connected to the connection portion of the electric device 5 is not a board built-in type connector.

<Wire Harness Manufacturing System>

In FIGS. 1A and 1B, when the assembly of the wire harness 1 is finished, conduction inspection of the wire harness 1 and writing of the terminal information into the control box 6 are performed thereafter. In order to perform the conduction inspection and the writing of the terminal information, the wire harness manufacturing system 29 as shown in FIG. 9 is employed. The wire harness manufacturing system 29 includes the conduction inspection device 30 and the information writing device 31. The wire harness manufacturing system 29 is configured such that the information writing device 31 can write the terminal information in the control box 6 while using the conduction inspection device 30. The wire harness manufacturing system 29 may have a structure in which a body portion of the information writing device 31 is integrated with the conduction inspection device 30 or a structure in which such devices are separated.

<Conduction Inspection Device>

In FIG. 9, the conduction inspection device 30 includes: an inspection table (not shown) on which the wire harness 1 is placed and inspected; and an inspection function portion 32 configured to perform the conduction inspection. The inspection function portion 32 includes: a board 33; a plurality of checker fixtures 34; and a current output portion 35. The board 33 includes: an inspection circuit 36; a numerical value acquisition portion 37; a microcomputer (CPU) 38; a display portion 39; a numerical value output portion 40; and interfaces 41, 42. The inspection circuit 36 is a circuit necessary for performing the conduction inspection, and is integrated with a body portion 43 of the numerical value acquisition portion 37 in the present embodiment. The numerical value acquisition portion 37 is a portion constituting the information writing device 31 instead of the conduction inspection device 30, and the above body portion 43 is provided as a circuit configured to acquire electric numerical values to be described below. The microcomputer 38 has a function of variously controlling the conduction inspection device 30 by executing programs incorporated in advance. The display portion 39 is provided as a portion configured to display a determination related to the conduction inspection. The plurality of checker fixtures 34 are connected to the interface 41. The plurality of checker fixtures 34 can be attached in a freely detachable manner to the connectors 28 on the other end side of the plurality of sub-harnesses 14 of the wire harness 1. The plurality of checker fixtures 34 are integrally provided with a numerical value acquisition portion 44 constituting the numerical value acquisition portion 37. The numerical value acquisition portion 44 is electrically connected to the body portion 43. The numerical value acquisition portion 44 is provided integrally with the checker fixtures 34 as a portion configured to detect a resistance value at a position of the connector 28 on the other end side. The numerical value acquisition portion 44 may also be provided separately from the checker fixtures 34. The numerical value acquisition portion 44 may also be provided as a portion configured to detect a conductor resistance value of the sub-harness 14 instead of the resistance value at the position of the connector 28. In addition, the resistance value may be set in advance in each checker fixture 34, and the numerical value acquisition portion 44 may be provided as a portion configured to detect an electric numerical value through using the resistance value.

The conduction inspection device 30 places the wire harness 1 on the inspection table (not shown), attaches the checker fixture 34 to the connector 28 on the other end side of the sub-harness 14, and then starts the inspection by connecting a power supply line 45 to the control box 6 and flowing a current from the current output portion 35. For example, a display corresponding to OK is displayed on the display portion 39 if conduction is ensured. On the contrary, a display corresponding to NG is displayed on the display portion 39 if the conduction is not ensured. During the conduction inspection, the writing of the terminal information into the control box 6 is performed at the same time in the information writing device 31. The wire harness 1 in which the conduction is ensured and the writing of the terminal information is completed is conveyed to an automobile manufacturing line or the like after completion of a series of processes related to manufacturing. Then the wire harness 1 is installed.

<Information Writing Device>

In FIGS. 8 and 9, the information writing device 31 is a device capable of writing the terminal information of the plurality of sub-harnesses 14 to the box side storage portion 27 of the control box 6 after the assembly of the wire harness 1 is completed, and is effective in that the writing is not required to be performed in a manufacturing stage of the board 9 (see FIG. 6). In the related art, since the terminal information is written in the manufacturing stage of the board 9, a connection destination of the sub-harness 14 to the control box 6 is fixed. If the terminal information can be written after the assembly of the wire harness 1 is completed, there is no need to newly design and manufacture the control box 6 even when there is a difference in the vehicle type, grade, destination or the like. That is, an increase in product numbers (varieties) of the board 9 and the control box 6 can be prevented. In other words, the board 9 and the control box 6 can be designed in common, and cost reduction can thus be achieved. An example of a configuration of the information writing device 31 will be described below.

The information writing device 31 includes: the numerical value acquisition portion 37; a synchronizing portion 46; a microcomputer (CPU) 47; a terminal information storage portion 48; an information writing portion 49; an input portion 50; and a display portion 51. In the present embodiment, the information writing device 31 is configured such that the above configuration is arranged across the conduction inspection device 30 and a personal computer 52. The above configuration may also be integrated into the conduction inspection device 30. The numerical value acquisition portion 37 is configured to acquire an electric numerical value at the position of the other end of the sub-harness 14 in a conductive state. The numerical value acquisition portion 37 includes: the body portion 43; the numerical value acquisition portion 44; and the numerical value output portion 40. As shown in FIG. 9, the numerical value acquisition portion 37 is arranged in the conduction inspection device 30. The microcomputer 47 has a function of variously controlling the information writing device 31 by executing programs incorporated in advance. Such a control function includes control related to the writing of the terminal information, as shown in a flowchart of FIG. 10. In FIG. 10, specifically, initial setting is performed at first, and thereafter, a process of determining whether the writing is completed is performed (step S11). Of course, the writing is still not performed at the beginning. In order to correspond to the plurality of sub-harnesses 14 or to correspond to the number of the box side connectors 10 of the control box 6, the process of step S11 is performed. If the writing is not completed in the process of step S11 (N), the process proceeds to step S12 to write the corresponding terminal information. On the other hand, if the writing is completed (Y), the process proceeds to step S13, and control related to the writing of the terminal information is performed such that an end of the writing is displayed on the display portion 51 and a series of processes are ended.

Referring back to FIGS. 8 and 9, the terminal information storage portion 48 is configured to store a plurality of terminal information in advance. The terminal information storage portion 48 includes a non-volatile memory, and stores a number of pieces of terminal information corresponding to at least the plurality of sub-harnesses 14, that is, a name of a terminal to be connected, an operation current value, an operation mode, a resistance value, and the like. The terminal information is input from the input portion 50 and stored in the terminal information storage portion 48. The terminal information stored in the terminal information storage portion 48 is linked one-to-one to resistance values acquired by the numerical value acquisition portion 37. The information writing portion 49 reads the corresponding terminal information from the terminal information storage portion 48 based on the resistance value, and writes the read terminal information in the box side storage portion 27 of the corresponding IPD 22. The writing into the box side storage portion 27 is performed at the same timing as the conduction inspection of the conduction inspection device 30 due to the synchronizing portion 46.

<Wire Harness Manufacturing System>

As can be seen from the above description, the wire harness manufacturing system 29 includes: the conduction inspection device 30 configured to inspect the conductive state at the position of other end of each of the plurality of sub-harnesses 14 in a state that one end of each of the plurality of sub-harnesses 14 is connected to the control box 6; and the information writing device 31 configured to write the terminal information of the plurality of sub-harnesses 14 in the box side storage portion 27 of the control box 6 while using the conduction inspection device 30.

<Wire Harness Manufacturing Method>

As can be seen from the above description, the wire harness manufacturing method includes: a first process of connecting each one end of the plurality of sub-harnesses 14 to the control box 6; a second process of using the conduction inspection device 30 to inspect the conductive state at the position of other end of each of the plurality of sub-harnesses 14; and a third process of using the information writing device 31 to write the terminal information of the plurality of sub-harnesses 14 in the box side storage portion 27 of the control box 6 while using the conduction inspection device 30.

<Effects of Wire Harness Manufacturing System and Wire Harness Manufacturing Method>

As described above with reference to FIGS. 1A to 10, according to the wire harness manufacturing system 29 according to one embodiment, the information writing device 31 used together with the conduction inspection device 30 is included in the configuration of the system, so that the information writing device 31 can write the terminal information later during the conduction inspection performed after the assembly of the wire harness 1. That is, the terminal information can be written in the control box 6 later according to the vehicle type, grade, destination, and the like. In other words, the terminal information of the sub-harness 14 can be written in the control box 6 by the information writing device 31 after the sub-harness 14 is connected to the control box 6. Therefore, there is no need to newly design and manufacture the control box 6 even if there is a difference in the vehicle type, grade, destination, and the like. According to the wire harness manufacturing system 29, an increase in the product numbers (varieties) of the control box 6 and the board 9 can be prevented. According to the wire harness manufacturing system 29, the control box 6 and the board 9 can be commonly designed.

According to the wire harness manufacturing system 29, since the sub-harness 14 can be connected to any of the box side connectors 10 of the control box 6, the number of work steps can be reduced, and versatility can be provided as compared with the related art. Moreover, according to the wire harness manufacturing system 29, since the writing of the terminal information is performed at the same timing as the conduction inspection (since synchronization is performed), the number of work steps can be reduced as described above. In addition, according to the wire harness manufacturing system 29 of the present embodiment, since the plurality of sub-harnesses 14 are connected to the control box 6 in the I type, automatic production can be enabled. Moreover, according to the wire harness manufacturing system 29, a process area for manufacturing the wire harness 1 can be reduced by the above-described synchronization and automatic production.

Meanwhile, according to the wire harness manufacturing method, since the wire harness manufacturing system 29 is employed, the same effects as those described above can be achieved.

According to the wire harness manufacturing system 29 and the manufacturing method, the increase in the product numbers (varieties) of the control box 6 and the board 9 can be prevented even when there is a difference in the vehicle type, grade, destination, and the like.

The above description has been given with the name of the control box 6, the present invention is also applicable to a control box or the like that can communicate, which is generically characterized as "electric junction box" as follows. An electric junction box manufacturing system includes: the conduction inspection device 30 configured to inspect the conductive state at the position of other end of each of the plurality of sub-harnesses 14 in a state that one end of each of the plurality of sub-harnesses 14 is connected to the electric junction box; and the information writing device 31 configured to write the terminal information of the plurality of sub-harnesses 14 in a box side storage portion (box side storage portion 27) of the electric junction box while using the conduction inspection device 30.

DESCRIPTION OF REFERENCE NUMERALS AND SIGNS

1 . . . wire harness, 2 . . . automobile, 3 . . . power supply, 4 . . . fuse box, 5 . . . electric device, 6 . . . control box, 7 . . . harness body, 8 . . . case, 9 . . . board, 10 . . . box side connector, 11 . . . power supply connection portion, 12 . . . external connection portion, 13 . . . power supply line, 14 . . . sub-harness, 15 to 17 . . . interface, 18 . . . board body, 19 . . . distribution circuit, 20 . . . microcomputer, 21 . . . storage device, 22 . . . IPD, 23 . . . power supply line, 24, 25 . . . control line, 26 . . . switching element, 27 . . . box side storage portion, 28 . . . connector, 29 . . . wire harness manufacturing system, 30 . . . conduction inspection device, 31 . . . information writing device, 32 . . . inspection function portion, 33 . . . board, 34 . . . checker fixture, 35 . . . current output portion, 36 . . . inspection circuit, 37 . . . numerical value acquisition portion, 38 . . . microcomputer, 39 . . . display portion, 40 . . . numerical value output portion, 41, 42 . . . interface, 43 . . . body portion, 44 . . . numerical value acquisition portion, 45 . . . power supply line, 46 . . . synchronizing portion, 47 . . . microcomputer, 48 . . . terminal information storage portion, 49 . . . information writing portion, 50 . . . input portion, 51 . . . display portion, 52 . . . personal computer

What is claimed is:

1. A wire harness manufacturing system comprising:
a conduction inspection device configured to inspect a conductive state at a position of other end of each of a plurality of sub-harnesses in a state that one end of each of the plurality of sub-harnesses is connected to a control box; and
an information writing device configured to write terminal information of the plurality of sub-harnesses in a box side storage portion of the control box, wherein
the conduction inspection device includes a plurality of checker fixtures for conduction check, the other end of each of the sub-harnesses is connected to a respective one of the checker fixtures such that each sub-harness extends from the control box to the respective one of the checker fixtures.

2. The wire harness manufacturing system according to claim 1,
wherein the information writing device includes:
a numerical value acquisition portion configured to acquire an electric numerical value at the position of the other end of each of the plurality of sub-harnesses in the conductive state;
a terminal information storage portion configured to store a plurality of the terminal information corresponding to the plurality of sub-harnesses; and
an information writing portion configured to read corresponding terminal information from the terminal information storage portion based on the electric numerical value and write the corresponding terminal information in the box side storage portion.

3. The wire harness manufacturing system according to claim 2,
wherein the information writing device further includes a synchronizing portion which enable to write the terminal information during inspecting the conductive state.

4. The wire harness manufacturing system according to claim 2,
wherein the plurality of checker fixtures are integrally or separately provided with the numerical value acquisition portion.

5. The wire harness manufacturing system according to claim 4,
wherein the numerical value acquisition portion which is integrally provided is configured to read a resistance value of the checker fixture when a predetermined current is applied from the control box side.

6. The wire harness manufacturing system according to claim 4,
wherein the numerical value acquisition portion which is separately provided is configured to read a resistance value of the checker fixture when a predetermined current is applied from the control box side.

7. The wire harness manufacturing system according to claim 1,
   wherein a connection portion of the one end of each of the plurality of sub-harnesses are connectable to a frontage of each of a plurality of box side connectors provided in the control box.

8. A wire harness manufacturing method comprising:
   connecting one end of each of a plurality of sub-harnesses to control box and other end of the plurality of sub-harnesses to a respective one of a plurality of checker fixtures such that each of the sub-harnesses extends from the control box to a respective one of a plurality of checker fixtures;
   using a conduction inspection device and inspecting a conductive state at a position of the other end of each of the plurality of sub-harnesses; and
   using an information writing device and writing terminal information of the plurality of sub-harnesses in a box side storage portion of the control box.

* * * * *